United States Patent [19]

Holonyak, Jr. et al.

[11] Patent Number: 4,871,690
[45] Date of Patent: Oct. 3, 1989

[54] SEMICONDUCTOR STRUCTURES UTILIZING SEMICONDUCTOR SUPPORT MEANS SELECTIVELY PRETREATED WITH MIGRATORY DEFECTS

[75] Inventors: Nick Holonyak, Jr., Urbana, Ill.; Robert D. Burnham, Palo Alto, Calif.

[73] Assignee: Xerox Corporation, Stamford, Conn.

[21] Appl. No.: 148,737

[22] Filed: Jan. 27, 1988

Related U.S. Application Data

[62] Division of Ser. No. 820,044, Jan. 21, 1986.

[51] Int. Cl.$^4$ .................... H01L 21/203; H01L 33/00
[52] U.S. Cl. ..................................... 437/105; 437/20; 437/22; 437/24; 437/25; 437/26; 437/107; 437/129; 437/133; 437/141; 437/247; 437/173; 437/954; 437/61; 437/91; 148/DIG. 35; 148/DIG. 90; 148/DIG. 95; 148/DIG. 160
[58] Field of Search ................... 437/20, 22, 26, 24, 437/23, 105, 107, 129, 128, 127, 126, 133, 134, 141, 173, 174, 247, 954; 357/91, 61, 4; 148/DIG. 90, DIG. 95, DIG. 35, DIG. 160

[56] References Cited

U.S. PATENT DOCUMENTS

| | | | |
|---|---|---|---|
| 3,976,511 | 8/1976 | Johnson | 437/26 |
| 4,205,329 | 5/1980 | Dingle et al. | 437/107 |
| 4,234,358 | 11/1980 | Celler et al. | 437/20 |
| 4,261,771 | 4/1981 | Dingle et al. | 437/132 |
| 4,278,475 | 7/1981 | Bartko et al. | 437/26 |
| 4,378,255 | 3/1983 | Holonyak, Jr. et al. | 357/61 |
| 4,391,651 | 7/1983 | Yoder | 437/26 |
| 4,511,408 | 4/1985 | Holonyak, Jr. | 357/91 |
| 4,529,455 | 7/1985 | Bean et al. | 437/105 |
| 4,597,165 | 7/1986 | Capasso et al. | 437/26 |
| 4,632,712 | 12/1986 | Fan et al. | 437/105 |
| 4,639,275 | 1/1987 | Holonyak, Jr. | 357/91 |
| 4,654,090 | 3/1987 | Burnham et al. | 357/91 |
| 4,716,125 | 12/1987 | Makiuchi | 437/129 |
| 4,748,132 | 5/1988 | Fukuzawa et al. | 437/129 |
| 4,771,010 | 9/1988 | Epler et al. | 437/129 |
| 4,786,608 | 11/1988 | Griffith | 437/26 |
| 4,806,502 | 2/1989 | Jorke et al. | 437/105 |

FOREIGN PATENT DOCUMENTS

| | | |
|---|---|---|
| 0103415 | 8/1983 | Japan ................... 357/4 |
| 0018192 | 1/1986 | Japan . |
| 0168981 | 7/1986 | Japan . |
| 0015875 | 1/1987 | Japan . |
| 0137868 | 6/1987 | Japan . |

Primary Examiner—Brian E. Hearn
Assistant Examiner—M. Wilczewski

[57] ABSTRACT

Different diffusion rates can be made operative relative to diffusion disordering in designated areas of a thin active layer or of quantum well feature compared to thermal disordering in other areas thereof where disordering is not desired by the selective placement of migratory defects in a semiconductor support means, such as a semiconductor substrate or semiconductor support layer for supporting subsequently epitaxially deposited semiconductor layers. Such migratory defects as used herein are intended to include impurities and/or other lattice defects initially introduced into the semiconductor support means prior to epitaxial deposition of semiconductor layers constituting the semiconductor structure, wherein at least one of such layers comprises a thin active layer (i.e., a layer with relative higher refractive index compared to the refractive index of at least contiguous epitaxially deposited layers) not necessarily capable of exhibiting quantum size effects or a quantum well feature capable of exhibiting quantum size effects. These migratory defects diffuse or migrate into subsequently grown epitaxial layers providing regions of higher lattice defects in the epigrown layers compared to regions of the same layers where no migratory defects were initially introduced into the semiconductor support means.

7 Claims, 4 Drawing Sheets

SEMICONDUCTOR STRUCTURES UTILIZING SEMICONDUCTOR SUPPORT MEANS SELECTIVELY PRETREATED WITH MIGRATORY DEFECTS

This is a division, of application Ser. No. 06/820,044, filed Jan. 21, 1986.

BACKGROUND OF THE INVENTION

This invention relates to semiconductor structures and more particularly to III-V semiconductor structures, such as semiconductor heterostructure lasers.

In the past, III-V semiconductor devices have been made by epitaxial growth performed on a single crystal substrate. After the epigrowth of the semiconductor layers, contact geometry is performed on the structure. For example, in the case of semiconductor lasers, a selective proton or ion implant may be performed to delineate a stripe region and active region where current pumping is performed to bring about lasing action. Expitaxial growth process may be carried out by liquid phase epitaxy (LPE), molecular beam epitaxy (MBE) or metalorganic chemical vapor deposition (MO-CVD).

Recently, advances have been made in the art to better delineate the bandgap and refractive indices properties in a single semiconductor device by disordering quantum well structures epitaxially deposited as part of a semiconductor device. An example of the foregoing is U.S. Pat. No. 4,378,255 to Holonyak wherein there is taught the technique of selectively disordering a multiple quantum structure of superlattice in a semiconductor device through the employment of a zinc diffusion thereby causing an upward shifting of the bandgap of the disordered material compared to regions of the multiple quantum well structure where disordering has not occurred. Such diffusions can be generally carried out in a temperature range of 500° C. to 600° C., which is lower than the epigrowth temperature which is about 750° C. Such disordering is also possible with other elements such as Si, Ge and Sn but at higher temperatures, e.g., about 675° C. Further, disordering is possible through implantation of elements acting as shallow or deep level impurities, such as, Se, Mg, Sn, O, S, Be, Te, Si, Mn, Zn, Cd, Sn, Cr or Kr followed by a high temperature anneal best performed in an As environment. In the case of impurity implant followed by an anneal, the anneal temperatures are relatively at higher temperatures compared to diffusion temperatures, e.g., above 800° C., such as 800° C. to 1200° C.

While the disordering of the superlattice can be carried out by the selective diffusion technique taught in U.S. Pat. No. 4,378,255, higher temperatures, necessary for other diffusion elements or necessary to utilize the implant/anneal technique, may also cause in some circumstances, some thermal disordering in regions where there is no diffusion or implant to be performed. That is to say, the normal cross diffusion temperatures of the superlattice components, such as 750° C. or greater, may be exceeded so that thermal disordering as well as diffusion disordering or implant/anneal disordering may also be brought about to some extent. The accompanying thermal diffusion will impair the desired sharp delineation desired between disordered and undisordered regions of the monolithic semiconductor device resulting in a lack of usefulness in the semiconductor device under fabrication.

We have discovered a means for accomplishing and maintaining desired delineation between disordered and undisordered regions in a semiconductor device under fabrication.

SUMMARY OF THE INVENTION

According to this invention, we have discovered that different diffusion rates can be made operative relative to diffusion disordering in designated areas of a thin active layer or of quantum well feature compared to thermal disordering in other areas thereof where disordering is not desired by the selective placement of dislocation effects in a semiconductor support means, such as a semiconductor substrate or semiconductor support layer for supporting subsequently epitaxially deposited semiconductor layers. Such dislocation effects as used herein are intended to include impurities and/or other lattice defects initially introduced into the semiconductor support means prior to epitaxial deposition of semiconductor layers constituting the semiconductor structure, wherein at least one of such layers comprises a thin active layer (i.e., a layer with relative higher refractive index compared to the refractive index of at least contiguous epitaxially deposited layers) not necessarily capable of exhibiting quantum size effects or a quantum well feature capable of exhibiting quantum size effects. These dislocation effects diffuse or migrate into subsequently grown epitaxial layers providing regions of higher lattice defects in the epigrown layers compared to regions of the same layers where no dislocation effects were initially introduced in the semiconductor support means.

The present invention, therefore, relates to a method of converting selected areas of a multilayer semiconductor region epitaxially deposited on a semiconductor support means, such as a semiconductor substrate or epitaxially deposited layer or layers, of single crystal and low defect density, into a disordered alloy higher bandgap and lower refractive index properties than the originally deposited material. Selected areas of the semiconductor support means are treated to include dislocation effects in such areas prior to epitaxial deposition of the semiconductor layers on the support means. These dislocation effects are forms of impurities induced into the support means or damage to the single crystal lattice of the support means and comprise, for example, a treatment by implantation, laser annealing, ion or electron bombardment, diffusion or such other type of treatment that will cause dislocation effects in the selected areas of the support means. Implantation may involve impurities, protons or III-V elements where the alloy regime employed for the semiconductor structure comprises III-V elemental compounds.

Epitaxial growth of the semiconductor region on the treated support means will propagate the dislocation effects from the treated areas of the support means into contiguous areas of the semiconductor layers as the same are being deposited. Subsequent annealing of the semiconductor structure will convert the areas effected by the propagated dislocation effects in thin semiconductor layers having high index properties or established quantum well features into a disordered alloy which will have higher bandgap and lower refractive index properties compared to areas of the same semiconductor layer which have not been effected by the propagated treatment of dislocation effects. The use of term "disordered" means either a partially disordered or a fully disordered thin high refractive index layer or a quantum well feature, such as a single or multiple quantum well structure.

An important feature of this invention is the ability to go to higher anneal temperatures required by some impurities to bring about a desired selective disordered alloy conversion without concern as to normal cross-diffusion or thermal disordering occurring in areas where treatment was not intended nor is desired. This is because the dislocation effects will disorder at an enhanced rate compared to untreated regions due to their presence in the epitaxially deposited layers on the support means.

The epitaxially deposited semiconductor region comprises at least one first thin active layer interposed between second barrier layers, e.g., a thin active layer of limited thickness, such as in the range of 0.5 nm to 2 nm thick not exhibiting quantum size effects, or a single quantum well structure or a multiple quantum well structure exhibiting quantum size effects. Disordering causes a full or partial intermixing of the first and second layers forming an alloy that will naturally have higher bandgap and lower refractive index properties compared to these same properties in the undisordered regions of the first layer. As a result, three dimensional semiconductor structures and devices may be created, inter alia, transistor and diode devices and semiconductor lasers, the latter device of which are exemplified herein.

Other objects and attainments together with a fuller understanding of the invention will become apparent and appreciated by referring to the following description and claims taken in conjunction with the accompanying drawing

Figure 2:
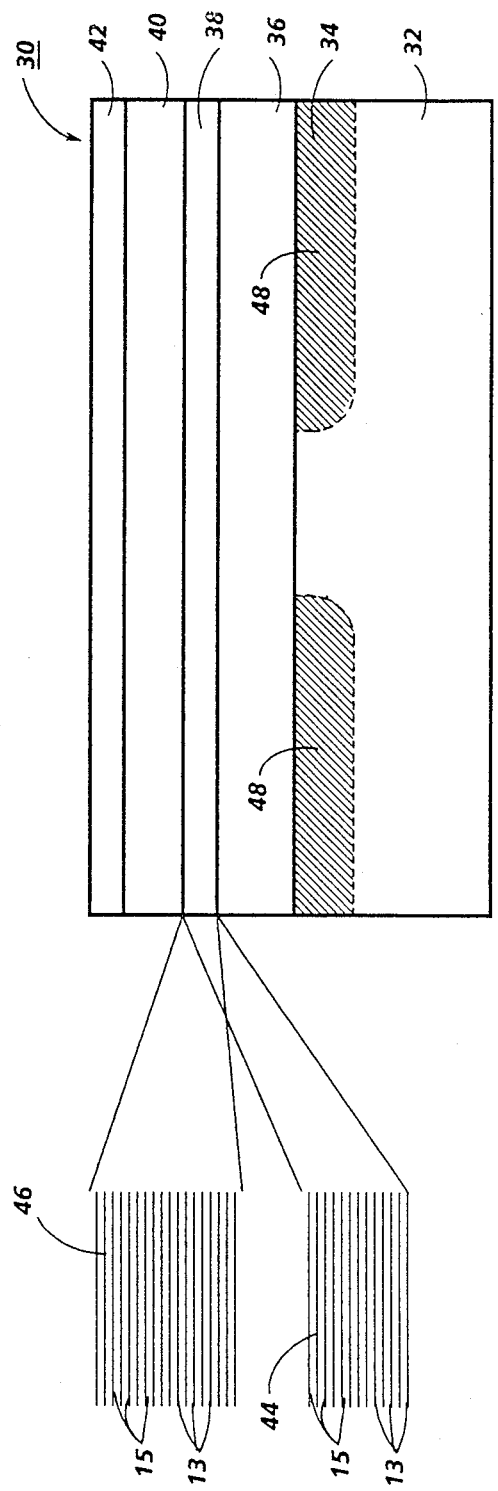
FIG. 2 is a diagrammatic side view of another semiconductor structure in the form of a heterostructure laser with a treated substrate prior to annealing in accordance with this invention.

Figure illustrates the heterostructure laser of FIG. 2 after annealing in accordance with this invention.

DETAILED DESCRIPTION OF ILLUSTRATIVE EMBODIMENTS

Figure 1:
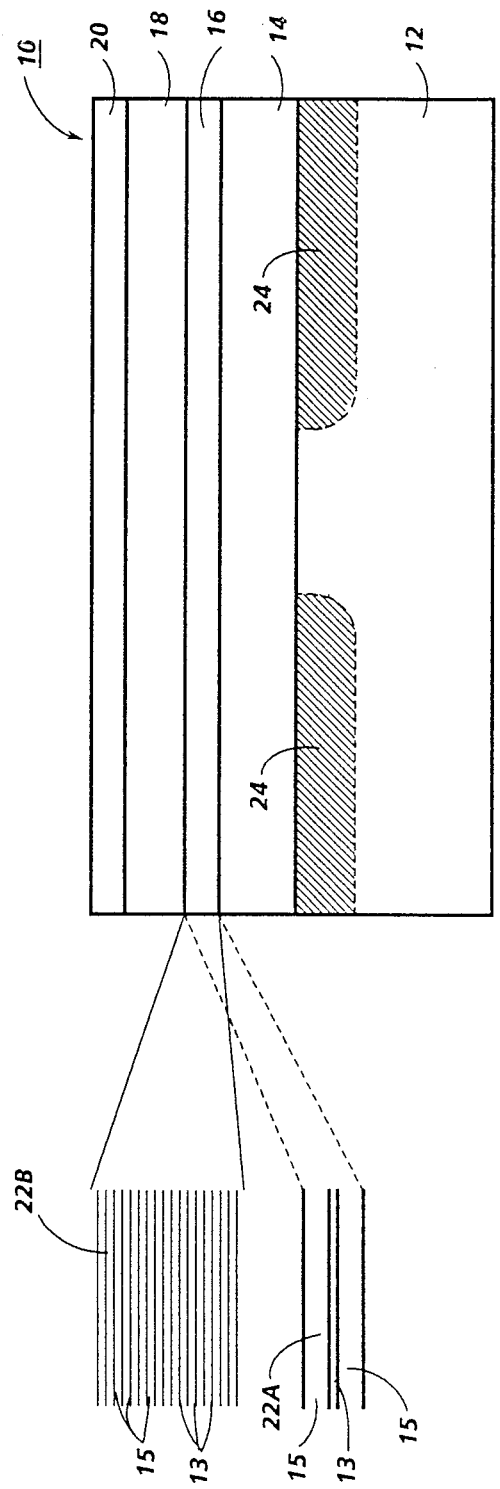
FIG. 1 is a diagrammatic side view of a semiconductor structure in the form of a heterostructure laser with a treated substrate prior to annealing in accordance with this invention.

Reference is now made to FIG. 1 wherein there is disclosed a heterostructure laser 10 which includes a semiconductor region 16 designed to exhibit quantum size effects as is known in the art. Laser 10 comprises a substrate 12 upon which is epitaxially deposited layers 14, 16, 18 and 20. Substrate 12, for example, may comprise n-GaAs. Deposited on substrate 12 are cladding layer 1 of n-$Ga_{1-x}Al_xAs$, semiconductor region 16 comprising a quantum well structure, cladding layer 18 of p-$Ga_{1-x}Al_xAs$ and cap layer 20 of P+-GaAs. Region 16 comprises at least one active well or layer 13 interposed between two barriers are layers 15 as illustrated in 22A in FIG. 1. This represents a single quantum well structure 22A. On the other hand, region 16 may comprise a multiple quantum well structure 22B consisting of alternating layers of wells 13 and barriers 15. In the case of both structure 22A and 22B, the wells 13 may comprise, for example, GaAs or $Ga_{1-w}Al_wAs$ where x and y > w. Barriers 15 may comprise AlAs or $Ga_{1-z}Al_zAs$ where z > w. For example, a well/barrier combination may be comprised of GaAs/AlAs or GaAs/$Ga_{1-z}Al_zAs$ or $Ga_{1-w}Al_wAs$/$Ga_{1-z}Al_zAs$ or $Ga_{1-w}Al_wAs$/AlAs.

Prior to the deposition of layers 14-20, treatment is conducted on substrate 12 in predefined or selected areas 24 to produce dislocation effects, i.e., damage of the crystallographic single crystal structure by any one of several techniques, such as implantation, laser annealing, ion or electron bombardment or diffusion. Implantation includes implant of impurities, protons or III-V elements. The rate of interdiffusion of Ga and Al in quantum well structures, i.e., the intermixing of layers 13 and 15 to form a disordered alloy, is related to some extent to the ease with which Ga and Al can move around in the lattice structure and single crystal material, such as substrate 12 or epitaxially deposited layers 14-20 with a sufficiently high number of defects would permit Ga and Al to interdiffuse more readily under the influence of high temperature. These defects may be introduced into substrate 12 as implanted shallow or deep level impurities such as Se, Mg, O, S, Be, Fe, Si, Mn, Zn, Cd, Sn, Cr or Kr. Also, the implant may be with protons or ions. Implant may further comprise III-V elements to provide the high level of defects such as B, Al, Ga, In, P, As and Sb.

Other methods of treatment are laser annealing by damaging the crystallographic structure of substrate 12 in predefined or selected areas. A further method of treatment would be by ion or electron bombardment. Another method is by thermal diffusion of preselected areas 24 of substrate 12 employing a disordering element such as Zn, Si, Ge or Sn which is diffused into substrate 12 forming areas 24. As to this treatment, see for example U.S. Pat. No. 4,378,255 and U.S. Pat. (Ser. No. 4,639,274).

Of particular interest is the implantation of oxygen into areas 24 to perform the dislocation effects in substrate 12. The use of oxygen as an implant element not only would provide an enhanced effects in substrate 12 but also provide a resistive region into areas above substrate areas 12 upon subsequent deposition of layers 14-20 and migration of the oxygen defects into areas immediately above substrate areas 24 of laser 10. The forming of these regions of higher resistivity will selectively provide current flow through the center portion of laser 10 as will be seen in connection with FIG. 3.

Many other semiconductor devices can be envisioned incorporating the pretreated support means 12 and semiconductor region 16 of this invention including, but not limited to, tunnel transistors and diodes.

After formation of areas 24 in substrate 12, the epitaxial deposition of layers 14, 18 and 20 and region 16 is completed. During the growth of layers 14-20, the defects created in the lattice structure of areas 24 will diffuse or migrate, as the case may be, upward into regions of these layers 36-42 directly above areas 24. In the case of pretreatment of areas 24 by implant of diffusion of impurities, the influence on the deposited layers above areas 24 will be by diffusion of the impurities upwardly therein during epitaxial growth. In the case of pretreatment of areas 24 by other lattice damaging processes, such as laser annealing, proton or ion bombardment or proton or ion implant, the influence on the deposited layers thereabove will be by migration of the deflects upwardly therein during epitaxial growth.

In FIG. 2, another version of a semiconductor laser is illustrated. Laser 30 comprises a substrate 32 of N-GaAs upon which is epitaxially deposited a buffer layer 34 of n+-GaAs, a cladding layer 36 of n-$Ga_{1-x}Al_xAs$, a semiconductor region 38, a cladding region 40 of p-Ga$_{1-x}$Al$_x$As and cap layer of p$^+$-GaAs 42. Region 38 comprises a multiple quantum well structure 44 comprises alternating layers of wells 13 and barriers 15 in the same manner as quantum well structure 22B. In addition, cladding region 40 also comprises alternating layers of wells 33 and barriers 35 as illustrated at 46 in FIG. 2. Wells 33 may comprise GaAs or Ga$_{1-m}$Al$_m$As where m is slightly greater than y. Barriers 35 may comprise GaAs or Ga$_{1-n}$Al$_n$As where n >m. The purposes of multiple quantum well cladding region 40 will become more evident later. However, its function is that of providing real refractive index waveguiding in the laser structure after completion of annealing treatment.

As in the case of laser 10, a pretreatment to provide dislocation effects in predefined or selected regions of support means of the laser. However, in the case of laser 30, such support means is in the form of buffer layer 34 which is initially deposited upon substrate 32 and then pretreated to form dislocation effects in its bulk in predefined areas 48. The treatment to damage the crystallographic structure may be the same as previously discussed relative to laser 10.

After formation of areas 48 in buffer layer 34, the epitaxial deposition of 38, 40 and 42 is completed. During the growth of layers 36-42, the defects created in the lattice structure of areas 48 will diffuse or migrate, as the case may be, upward into the regions of these layers 36-42 directly above areas 48.

After completion of growth of the semiconductor layers relative to lasers 10 and 30 is completed, the structures 10 and 30, which would be normally part of a wafer in fabrication as is known in the art, are annealed at an appropriate temperature for a sufficient period of time to cause damage induced areas immediately above damaged support means areas 24 and 48 to become disordered, which occurs at a faster rate than any potential disordering in areas above untreated areas of the support means, which potential disordering would be due only to thermal disordering due to high temperature anneal during an undesirably long period to time, via a vis diffusion disordering or implantation disodering. The effect of such disordering upon annealing is illustrated in FIG. 3 for laser 10 and in FIG. 4 for laser 30.

Figure 3:
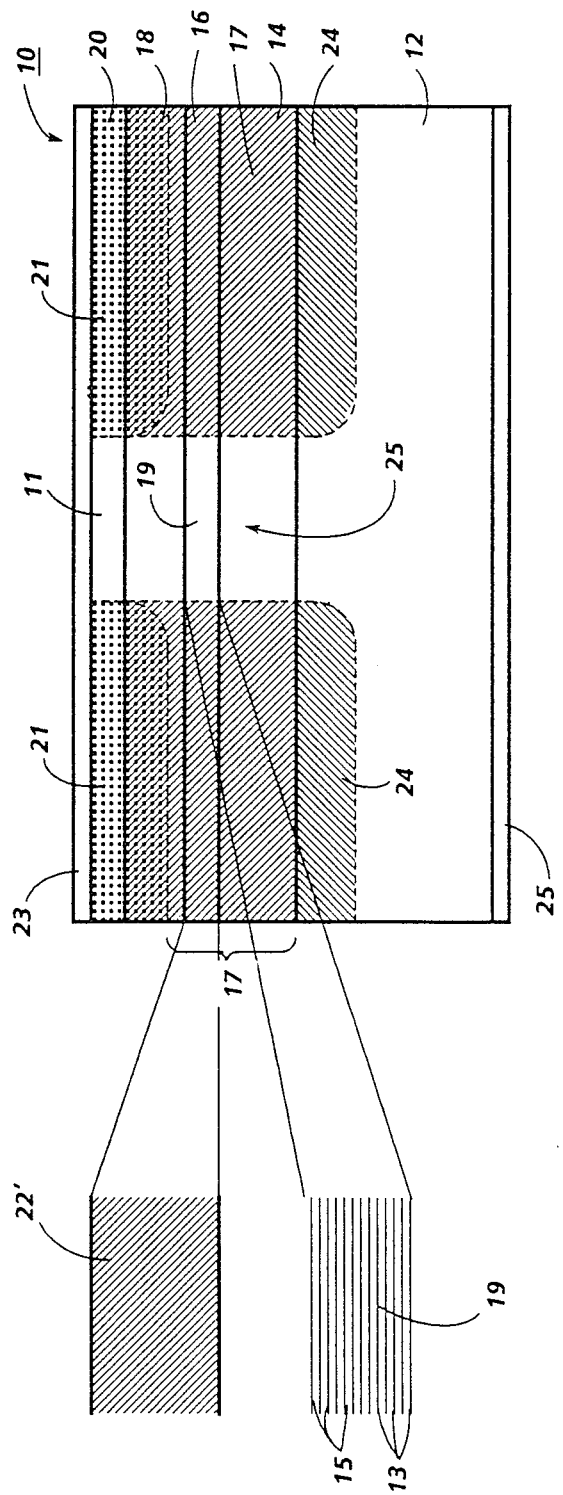
FIG. 3 illustrates the heterostructure laser of FIG. 1 after annealing in accordance with this invention.

As illustrated in FIG. 3, the cross-hatched regions 17 illustrates the areas effected by the influence of propagating dislocation effects during deposition of layers 14-20. Upon subsequent annealing, portions of region 16 in regions 17 will become disordered due to the thermal treatment, as illustrated at 22' in FIG. 3. However, portion 19 of region 16 will not become disordered and will remain the same as originally deposited as illustrated at 19 in FIG. 3. The disordered portions 22' comprise a mixture or alloy of GaAlAs that will have a resulting bandgap and refractive index higher than that of portion 19. This anneal and conversion results in the formation of an index waveguide region defined by channel 27 between portions 17 of laser 10.

The structure of laser 10 may be completed by providing a selective proton or ion implant through cap layer 20 into cladding layer 18 to form the stripe 11 as is known in the art Fabrication of laser 10 is completed by deposition of metal contact 23 on the top surface of cap layer 20 and metal contact 25 on the bottom surface of substrate 12.

Figure 4:
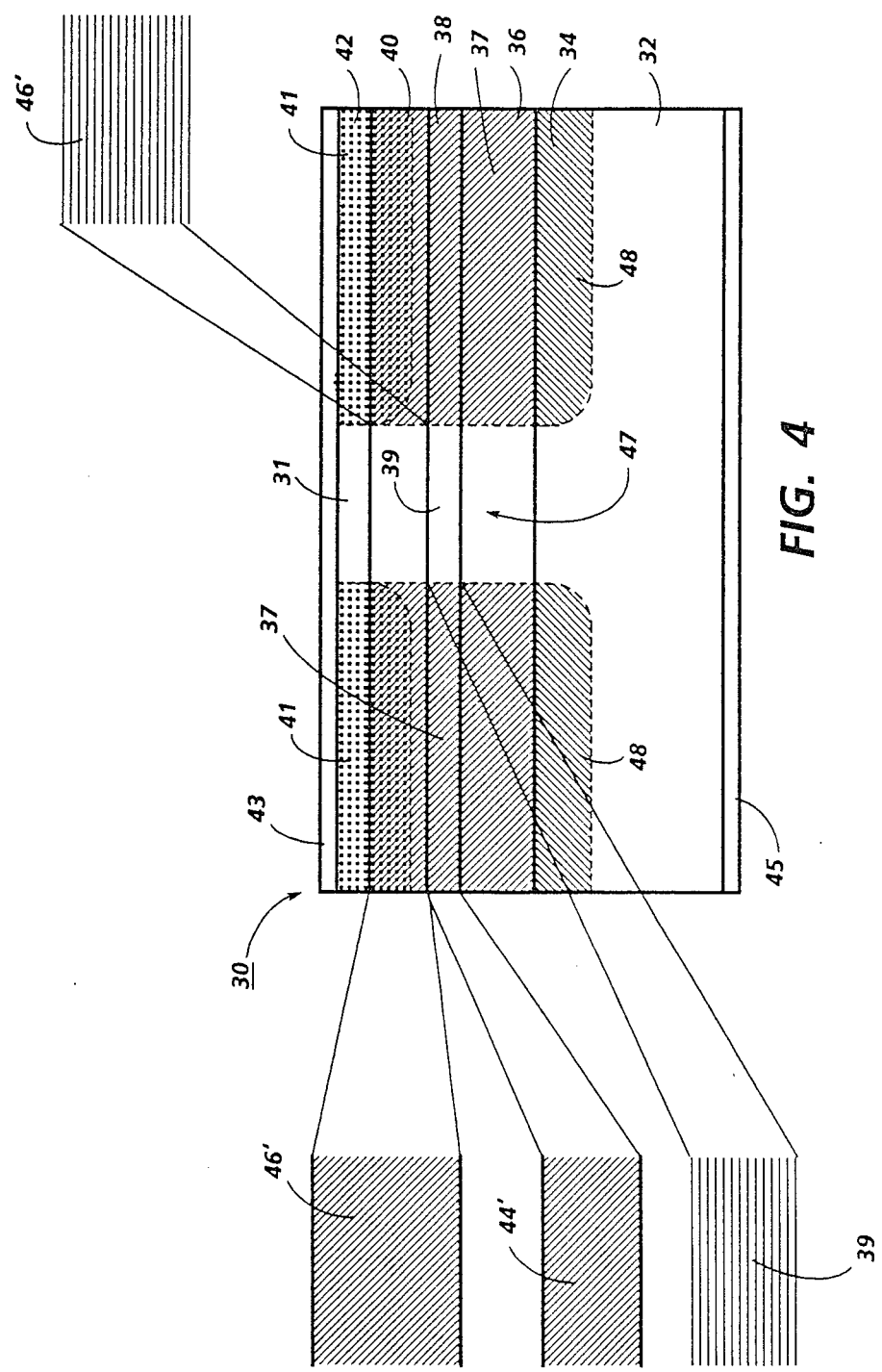

As illustrated in FIG. 4, the cross-hatched regions 37 illustrate the areas effected by the influence of propagating dislocation effects during deposition of layers 36-42. Upon subsequent annealing, portions of regions 38 and 40 in regions 37 will become disordered due to the thermal treatment, as illustrated respectively at 44' and 46' in FIG. 4. The disordered portions 44' and 46' comprise a mixture or alloy of GaAlAs that will have a resulting bandgap and refractive index higher than that of portions 39 and 46" which have not become disordered. This anneal and conversion results in the formation of an index waveguide region defined by channel 47 between portions 37. Cladding region 40 provides a unique function of incorporating a real refractive index guide in channel 47 since portions 46' of region 40 will have a higher refractive index compared to central portion 46".

It should be noted that region of the same type as region 40 may be utilized also in place of cladding layer 36 to achieve the same result either alone or in combination with multilayer region 40.

The structure of laser 30 may be completed by providing a selective proton or ion implant through cap layer 42 to cladding region 40 or into cladding region 40 to form stripe 31 as is known in the art. Fabrication of laser 30 is completed by deposition of metal contact 43 on the top surface of cap layer 42 and metal contact 45 on the bottom surface of substrate 32.

Anneal temperature may be within the range of 500° C. to 900° C. depending upon the particular support means pretreatment that is utilized. For example, if an implant of Si is provided in n-GaAs substrate 12 in predefined regions 24 the anneal temperature would be carried out in the range of 800° C. to 900° C. In the case of a ZnO diffusion in predefined areas 24, the anneal temperature would be carried out in the range of 500° C. to 600° C.

It should be noted that in some cases, the anneal temperature may exceed the cross diffusion temperature of superlattice components of regions 16, 38 and 40, i.e., above 750° C. However, the influence of the diffused impurities or migrated defects into regions 17 and 37 causes rapid conversion to a disordered alloy in sufficient time prior to the onslaught of full thermal disordering occurring in central regions 19, 39 and 46". The anneal treatment is dependent upon the type of pretreatment to support means 12 and 34 and the type of epitaxial deposited structure that is contemplated by anneal times may range from several minutes to one hour.

As previously indicated, the use of elements, such as oxygen or proton implants in support means 12 and 34, will provide an added feature of higher electrical resistance properties in regions 17 and 37. The result is that regions 17 and 37 are of higher electrically resistive value compared to regions of channels 17 and 38 so that pumping current supplied to the lasers via their contacts will flow most naturally in areas of channels 17 and 37.

The advantages gained from the pretreatment/growth/anneal technique of this invention is the fabrication of three dimensional semiconductor structures wherein predefined or selected areas may be treated to have a resultant higher bandgap or refractive index compared to untreated areas, which predefined areas may also have high electrical resistance properties as well. Because the dislocation effects are not thermally diffused or implanted in a previously epitaxially grown structure but are administered to support means to provide damped or defect areas that are subsequently carried or migrated into contiguous regions of the subsequently deposited semiconductor layers an effect difference in the rate of disordering can be achieved so that the desired effects of disordering in selected regions can be carried out in spite of anneal temperatures exceeding for a chart time the normal cross-diffusion temperatures of superlattice components in the deposited semiconductor regions of quantum size effect.

While this invention has been described in conjunction with specific embodiments, it is evident that many alternatives, modifications and variations will be apparent to those skilled in the art in light of the foregoing description. For example, other III–V regimes may be utilized in lieu of the GaAs/GaAlAs regime. Further, doping of the illustrated layers of laser 10 and 30 may be inverted from p to n and n to p. Further, wells 13 and barriers 16 may be p or n doped rather than undoped.

Accordingly, the invention is intended to embrace all such alternatives modifications, and variations as fall within the spirit and scope of the appended claims.

What is claimed is:

1. A method of converting selected areas of a multilayer semiconductor region, epitaxially deposited on a semiconductor support means of single crystal and low defect density, said region comprising at least one first active well layer interposed between second barrier layers into a disordered alloy of both said first and second layers, said alloy exhibiting higher bandgap and refractive index properties than said first layer and comprising the steps of
    (a) initially treating selected areas of said support means to provide dislocation effects therein,
    (b) epitaxially depositing said semiconductor region, said dislocation effects propagating from said support means selected areas into contiguous areas of said semiconductor region as the same is being deposited,
    (c) thereafter annealing said structure to convert said region selected areas into said disordered alloy.

2. A method of forming thermally disordered regions in a multilayer semiconductor structure which comprises a first semiconductor active region interposed between second semiconductor barrier regions deposited on the planar surface of a semiconductor support means, into a disordered alloy of both said first and second semiconductors, said alloy exhibiting a higher energy bandgap than said first active semiconductor region and comprising the steps of
    incorporating dislocation effects into selective areas of said support means prior to the epitaxial deposition of said first and second regions,
    Annealing the structure after said epitaxial deposition to cause the migration of said dislocation effects in said selected areas transversely relative to the plane of said surface into contiguously deposited regions of said first and second regions to convert said transverse contiguous regions into a disordered alloy of both of said first and second semiconductors, the rate of said conversion of said transverse contiguous regions exceeding the rate of conversion of regions laterally adjacent thereto and absent of said dislocation effects.

3. The method of forming thermally disordered regions of claim 2 wherein said said dislocation effects comprises the implantation in said selected areas of an impurity selected from the group consisting of Se, Mg, O, S, Be, Fe, Si, Mn, Zn, Cd, Sn, Cr and Kr.

4. The method of forming thermally disordered regions of claim 2 wherein said dislocation effects comprises the implantation of bombardment in said selected areas of protons, ions or electrons.

5. The method of forming thermally disordered regions of claim 2 wherein said dislocation effects comprises the implantation in said selected areas of an impurity selected from the group consisting of B, Al, Ga, In, P, As and Sb.

6. The method of forming thermally disordered regions of claim 2 wherein said dislocation effects comprises the thermal diffusion in said selected areas of an impurity selected from the group consisting of Zn, Si, Ge and Sn.

7. The method of forming thermally disordered regions of claim 2 wherein said dislocation effects comprises laser annealing in said selected areas.

* * * * *